United States Patent
Chen et al.

(10) Patent No.: US 7,420,251 B2
(45) Date of Patent: Sep. 2, 2008

(54) ELECTROSTATIC DISCHARGE PROTECTION CIRCUIT AND DRIVING CIRCUIT FOR AN LCD USING THE SAME

(75) Inventors: Chi-Ming Chen, Miao-Li (TW); Hung-Yu Chen, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 69 days.

(21) Appl. No.: 11/540,007

(22) Filed: Sep. 29, 2006

(65) Prior Publication Data
US 2007/0096214 A1 May 3, 2007

(51) Int. Cl.
*H01L 23/62* (2006.01)
(52) U.S. Cl. ............... 257/355; 257/356; 257/360; 257/358; 361/111
(58) Field of Classification Search .......... 257/355–564
See application file for complete search history.

(56) References Cited

U.S. PATENT DOCUMENTS

| | | | |
|---|---|---|---|
| 6,043,971 A | * | 3/2000 | Song et al. ............. 361/111 |
| 6,175,394 B1 | | 1/2001 | Wu et al. |
| 6,411,485 B1 | * | 6/2002 | Chen et al. ............. 361/111 |

* cited by examiner

*Primary Examiner*—Zandra Smith
*Assistant Examiner*—Telly D Green
(74) *Attorney, Agent, or Firm*—Wei Te Chung

(57) ABSTRACT

An exemplary ESD protection circuit includes first and second sets of transistors and an ESD discharge transistor. Each of the transistors includes a source electrode, a drain electrode, and a gate electrode. The drain electrodes and gate electrodes of each of the transistors are connected to each other, and the source electrodes of the transistors are respectively connected to the drain electrodes of the next adjacent transistors in both sets of the transistors. The gate electrode of the ESD transistor, the source electrodes of last transistors of the first and second sets of the transistors are connected to each other, the source electrode of the ESD transistor is connected to the drain electrode of a first transistor of the first set of the transistors, and the drain electrode of the ESD transistor is connected to the drain electrode of a first transistor of the second set of the transistors.

10 Claims, 4 Drawing Sheets

ELECTROSTATIC DISCHARGE PROTECTION CIRCUIT AND DRIVING CIRCUIT FOR AN LCD USING THE SAME

FIELD OF THE INVENTION

The present invention relates to electrostatic discharge (ESD) protection circuits used for apparatuses such as liquid crystal displays (LCDs). More particularly, the present invention relates to an ESD protection circuit that can for example be used for protecting gate lines and source lines of an LCD from electrostatic charge, and to a driving circuit of an LCD that employs the ESD protection circuit.

BACKGROUND

ESD damage is a well known phenomenon which can occur during the fabrication of semiconductor devices such as metal-oxide semiconductor structures. In particular, ESD damage can result in gate insulating layer breakdown, large shifts in threshold voltages, and large leakage currents between transistor electrodes.

One important kind of consumer and commercial LCD is the thin film transistor liquid crystal display (TFT-LCD). During a typical TFT-LCD fabricating process, static electricity may be generated on the TFT-LCD. If a large amount of electrical charge builds up at any one location on the TFT-LCD, the built up electrical charge is liable to discharge and thereby damage or destroy internal components of the TFT-LCD such as thin film transistors. To avoid the damaging effects of static electricity buildup and discharge during and after forming of the TFT-LCD array, a plurality of ESD protection circuits are employed in a typical TFT-LCD.

FIG. 4 is a schematic, abbreviated diagram of a layout of a conventional TFT LCD having a plurality of ESD protection circuits. The TFT-LCD 100 includes a first substrate (not shown), a second substrate (not shown), and a liquid crystal layer (not shown) sandwiched between the two substrates. The first substrate includes a plurality of gate lines 10 that are parallel to each other and that each extend along a first direction, a plurality of data lines 11 that are parallel to each other and that each extend along a second direction orthogonal to the first direction, a display region 12 (denoted by a broken line), common electrodes 13 formed at a periphery of the TFT-LCD 100, and a plurality of ESD protection circuits 14. The ESD protection circuits 14 are electrically connected between the common electrodes 13 and each of the gate lines 10 as well as between the common electrodes 13 and each of the date lines 11, respectively.

Also referring to FIG. 5, each ESD protection circuit 14 includes a first transistor 15, a second transistor 16, a third transistor 17, a first terminal 18, and a second terminal 19. Each transistor 15, 16 and 17 includes a source electrode 's', a drain electrode 'd', and a gate electrode 'g'. The drain electrode 'd' and gate electrode 'g' of the first transistor 15 are connected to each other. The drain electrode 'd' and gate electrode 'g' of the second transistor 16 are connected to each other. The gate electrode 'g' of the third transistor 17 and the source electrodes 's' of the first and second transistors 15 and 16 are connected to each other. The drain electrode 'd' of the first transistor 15 and the source electrode 's' of the third transistor 17 are connected together to define the first terminal 18. The drain electrodes 'd' of the second and third transistors 16 and 17 are connected together to define the second terminal 19. The first terminal 18 is connected to one of the gate lines 10 or one of the data lines 11, and the second terminal 19 is connected to one of the common electrodes 13. The first and second transistors 15 and 16 are serially connected between the first and second terminals 18 and 19.

Generally, operation of the ESD protection circuit 14 is as follows. When an electric potential difference generated by an ESD is greater than that of the serially connected first and second transistors 15 and 16, the third transistor 17 is turned on and a charge on the first terminal 18 flows to the common electrode 13 via the third transistor 17. Thus the ESD protection circuit 14 can prevent static electricity, generated in the process of fabricating the corresponding gate line 10 or data line 11 of the TFT-LCD 100, from destroying other internal circuits (not shown) of the TFT LCD 100.

However, in general, each of the gate lines 10 and data lines 11 has an operation voltage of 5V, which is greater than the threshold voltage of the corresponding ESD protection circuit 14. Therefore the third transistor 17 is liable to generate leakage current when the ESD protection circuit 14 in an off state. The sum of leakage currents of all the ESD protection circuits 14 causes the TFT-LCD 100 to have unduly high power consumption. In addition, the leakage currents of the ESD protection circuits 14 are liable to cause a voltage of each of the common electrodes 13 to waver. This in turn may lead to flickering occurring on a display screen of the TFT-LCD 100.

Accordingly, what is needed is an ESD protection circuit for a TFT-LCD that can overcome the above-described deficiencies.

SUMMARY

An exemplary electrostatic discharge protection circuit includes a first set of serially connected transistors and a second set of serially connected transistors, each transistor includes a source electrode, a drain electrode, and a gate electrode, wherein in the first set of serially connected transistors, the drain electrode and the gate electrode of each of the transistors are connected to each other, and the source electrode of each of the transistors is connected to the drain electrode of a next adjacent transistor, except for the source electrode of a last one of the transistors, and in the second set of serially connected transistors, the drain electrode and the gate electrode of each of the transistors are connected to each other, and the drain electrode of each of the transistors is connected to the source electrode of a next adjacent transistor, except for the drain electrode of a last one of the transistors; and a first electrostatic discharge transistor having a source electrode, a drain electrode, and a gate electrode. The gate electrode of the first electrostatic discharge transistor, the source electrode of the last transistor of the first set of serially connected transistors and the source electrode of a first one of the transistors of the second set of serially connected transistors are connected to each other, the source electrode of the first electrostatic discharge transistor is connected to the drain electrode of a first one of the transistors of the first set of serially connected transistors, the drain electrode of the first electrostatic discharge transistor is connected to the drain electrode of the last transistor of the second set of serially connected transistors, and the drain electrode of the first electrostatic discharge transistor is connected to the source electrode of the last transistor of the first set of serially connected transistors and to the source electrode of the first transistor of the second set of serially connected transistors.

An exemplary driving circuit employing the above-described electrostatic discharge protection circuit for a liquid crystal display includes a plurality of gate lines that are parallel to each other and that each extend along a first direction; a plurality of data lines that are parallel to each other and that each extend along a second direction orthogonal to the first direction; a plurality of common electrodes; and a plurality of electrostatic discharge protection circuits. A plurality of electrostatic discharge protection circuits is connected between one of the common electrodes and each of the gate lines, respectively, and another plurality of the plurality of electrostatic discharge protection circuits is connected between another one of the common electrodes and each of the date lines, respectively.

Other advantages and novel features will become more apparent from the following detailed description when taken in conjunction with the accompanying drawings.

DETAILED DESCRIPTION OF PREFERRED EMBODIMENTS

Reference will now be made to the drawings to describe embodiments of the present invention in detail.

Figure 1:
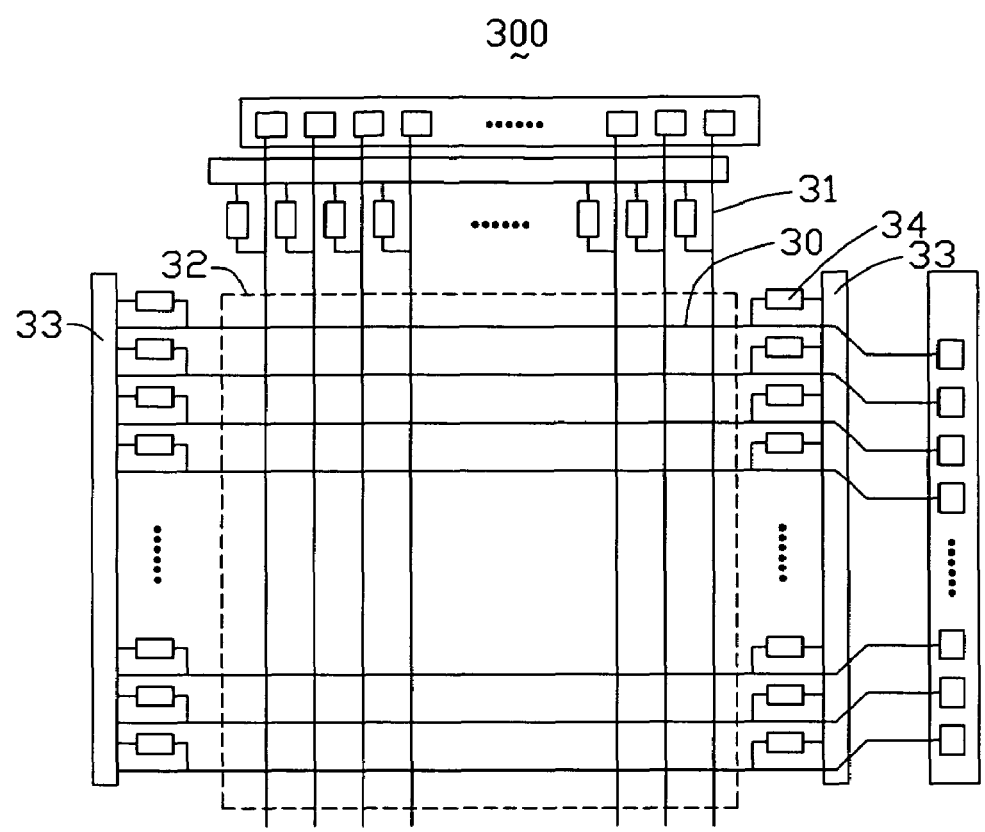
FIG. 1 is a schematic, abbreviated diagram of a layout of a TFT LCD having a plurality of ESD protection circuits in accordance with any of various exemplary embodiments of the present invention.

FIG. 1 is an abbreviated layout of a TFT-LCD having a plurality of ESD protection circuits in accordance with any of various exemplary embodiments of the present invention. The TFT-LCD 300 includes a first substrate (not shown), a second substrate (not shown), and a liquid crystal layer (not shown) sandwiched between the two substrates. The first substrate includes a plurality of gate lines 30 that are parallel to each other and that each extend along a first direction, a plurality of data lines 31 that are parallel to each other and that each extend along a second direction orthogonal to the first direction, a display region 32 (denoted by a broken line), a plurality of common electrodes 33 formed at a periphery of the TFT-LCD 300, and a plurality of ESD protection circuits 34. The ESD protection circuits 34 are electrically connected between the common electrodes 33 and each of the gate lines 30 as well as between the common electrodes 33 and each of the date lines 31, respectively.

Figure 2:
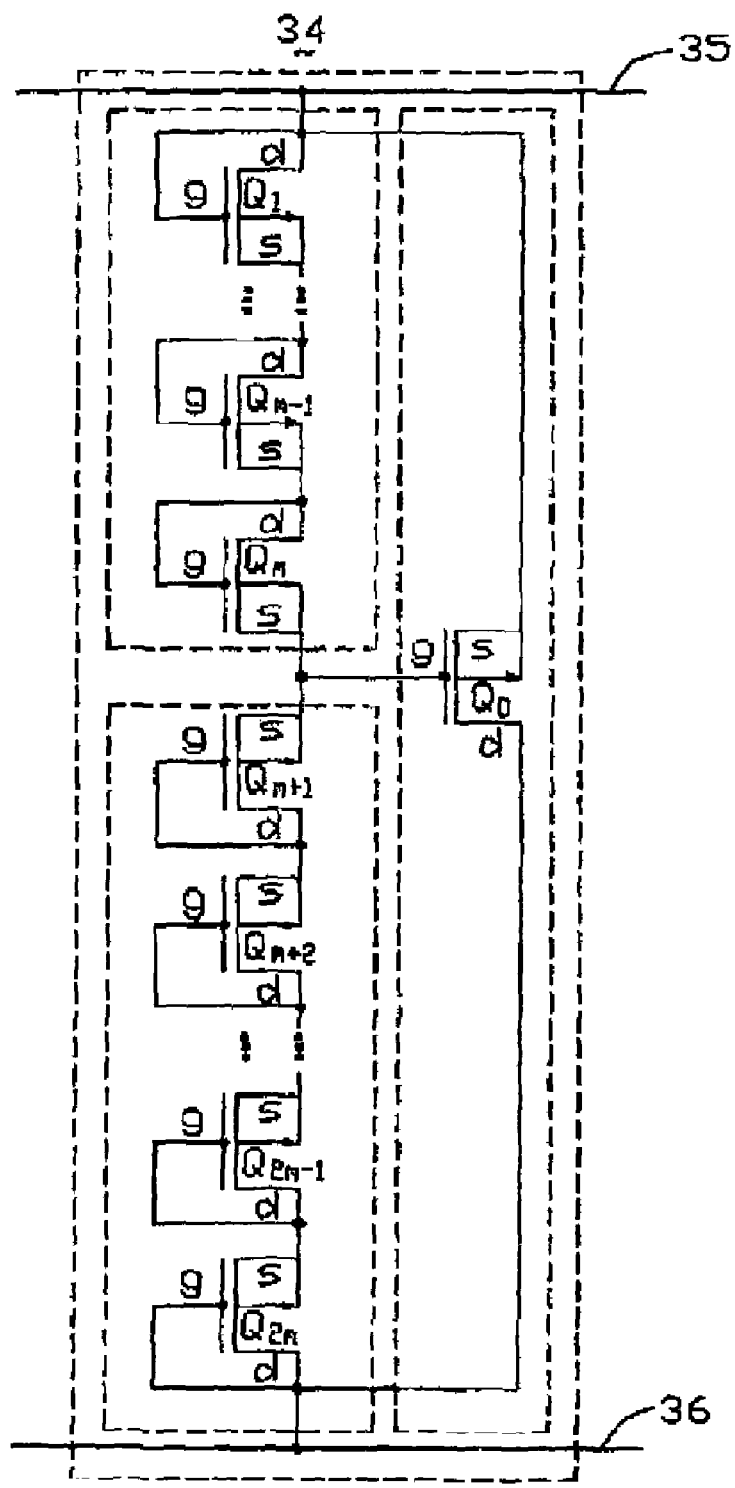
FIG. 2 is an abbreviated circuit diagram of an ESD protection circuit according to a first embodiment of the present invention.

Also referring to FIG. 2, each ESD protection circuit 34 includes a plurality of transistors; namely $Q_0$, and $Q_1$ to $Q_{2M}$ (M represents any desired integer greater than 1). Each of the transistors $Q_0$ and $Q_1$ to $Q_{2M}$ includes a source electrode 's', a drain electrode 'd', and a gate electrode 'g'. The drain electrode 'd' and gate electrode 'g' of each of the transistors $Q_1$ to $Q_{2M}$ are connected to each other. The transistors $Q_1$ to $Q_{2M}$ are divided into two sets of transistors. The first set of transistors includes transistors $Q_1$ to $Q_M$, which are serially connected one to another in numerical order. In particular, the source electrode 's' of one of the transistors $Q_1$ to $Q_{M-1}$ is connected to the drain electrode 'd' of the next adjacent one of the transistors $Q_2$ to $Q_M$. The second set of transistors includes transistors $Q_{M+1}$ to $Q_{2M}$, which are serially connected one to another in numerical order. In particular, the drain electrode 'd' of one of the transistors $Q_{M+1}$ to $Q_{2M-1}$ is connected to the source electrode 's' of the next adjacent one of the transistors $Q_{M+2}$ to $Q_{2M}$. The source electrodes 's' of the transistors $Q_M$ and $Q_{M+1}$ and the gate electrode 'g' of the transistor $Q_0$ are connected to each other. The drain electrode 'd' of the transistor $Q_1$ and the source electrode 's' of the transistor $Q_0$ are connected together to define a first terminal 35. The drain electrodes 'd' of the transistor $Q_{2M}$ and the transistor $Q_0$ are connected together to define a second terminal 36. The first terminal 35 is connected to one of the gate lines 30 or one of the data lines 31, and the second terminal 36 is connected to one of the common electrodes 33. The first and second sets of the transistors $Q_1$ to $Q_{2M}$ are serially connected between the first and second terminals 35 and 36. The transistors $Q_1$ to $Q_{2M}$ function as control elements, and the transistor $Q_0$ functions as an electrostatic discharge element.

In operation, when an electric potential difference generated by an ESD is greater than that of the serially connected first and second sets of the transistors $Q_1$ to $Q_{2M}$, the transistor $Q_0$ is turned on and a charge on the first terminal 35 flows to the common electrode 33 via the transistor $Q_0$. Thus the ESD protection circuit 34 can prevent static electricity, generated in the process of fabricating the corresponding gate line 30 or data line 31 of the TFT-LCD 300, from destroying other internal circuits (not shown) of the TFT LCD 300.

Typically, each of the gate lines 30 and data lines 31 has an operation voltage of 5V, which is greater than a threshold voltage of the ESD protection circuit 34. Unlike with the above-described conventional ESD protection circuit 14, the ESD protection circuit 34 includes two sets of serially connected transistors $Q_1$ to $Q_{2M}$, which makes the load of the ESD protection circuit 34 greater than that of the ESD protection circuit 14. Assuming that the first terminal 35 of the ESD protection circuit 34 has a same operation voltage as the first terminal 18 of the ESD protection circuit 14, then the ESD protection circuit 34 generates a smaller leakage current than the ESD protection circuit 14. Therefore the TFT-LCD 300 has lower power consumption than the above-described conventional TFT-LCD 100. In addition, wavering of a voltage of each of the common electrodes 33 is avoided or even eliminated. This means that a display screen of the TFT-LCD 300 has little or even no flickering. That is, the TFT-LCD 300 can provide good display characteristics.

Figure 3:
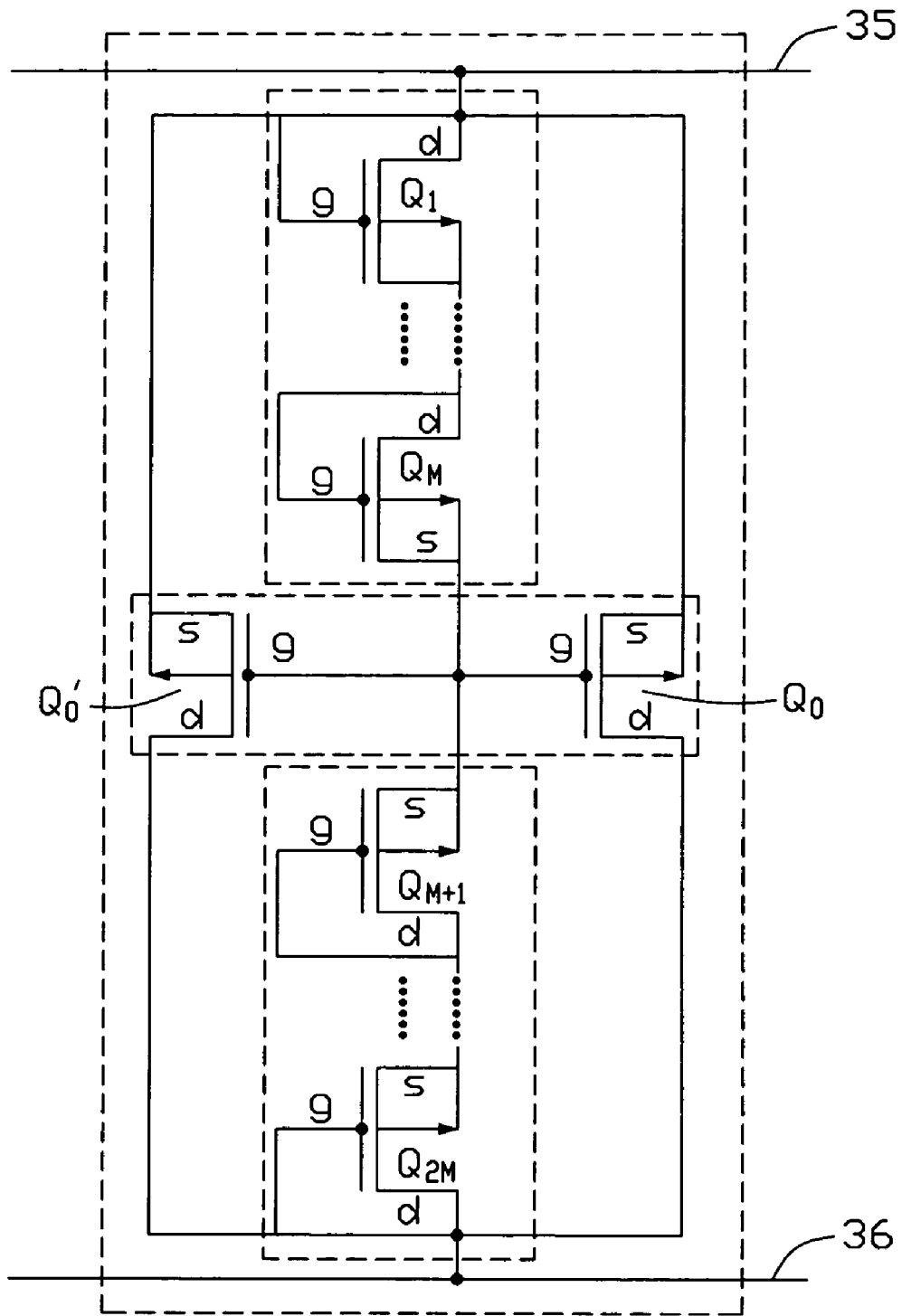
FIG. 3 is an abbreviated circuit diagram of an ESD protection circuit according to a second embodiment of the present invention.
Figure 4:
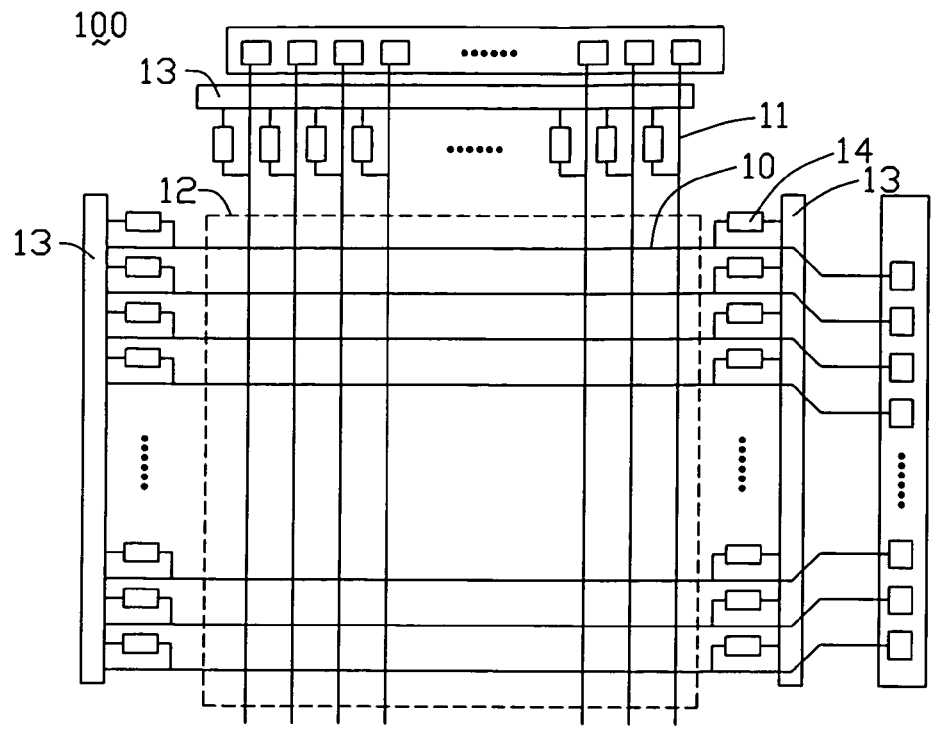
FIG. 4 is a schematic, abbreviated diagram of a layout of a conventional TFT LCD having a plurality of ESD protection circuits.
Figure 5:
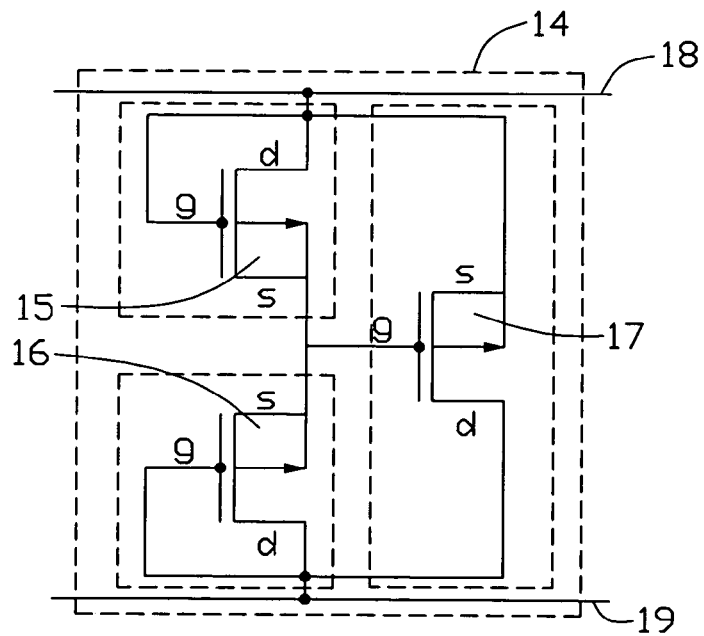
FIG. 5 is a circuit diagram of one of the ESD protection circuits of the TFT LCD of FIG. 4.

Referring to FIG. 3, this is an abbreviated circuit diagram of an ESD protection circuit according to a second embodiment of the present invention. The ESD protection circuit 44 of the second embodiment has a structure similar to that of the ESD protection circuit 34 of the first embodiment. The ESD protection circuit 44 further includes a transistor $Q_{0'}$ having a source electrode 's', a drain electrode 'd', and a gate electrode 'g', which are respectively connected to the source electrode 's' of the transistor $Q_0$, the drain electrode 'd' of the transistor $Q_0$, and the gate electrode 'g' of the transistor $Q_0$. The first and second sets of serially connected transistors $Q_1$ to $Q_{2M}$ are control elements, such that when an electric potential difference is greater than a combined threshold voltage of the first and second sets of serially connected transistors $Q_1$ to $Q_{2M}$, one or both of the electrostatic discharge transistors $Q_0$ and $Q_{0'}$ is turned on and charge flows through the ESD protection circuit 44 via one or both of the electrostatic discharge transistors $Q_0$ and $Q_{0'}$. Unlike with the ESD protection circuit 34 of the first embodiment, in the ESD protection circuit 44, when electrical charge generated by an ESD flows from the first terminal 35, the ESD protection circuit 44 can form two current paths between the first terminal 35 and the second terminal 36. That is, the two current paths are through the transistor $Q_0$ and the transistor $Q_{0'}$. Thus a maximum current of electrical charge that the ESD protection circuit 44 can tolerate without sustaining damage is larger that of the ESD protection circuit 34. Furthermore, even if a current of electrical charge damages or destroys one of the transistors $Q_0$ and $Q_{0'}$, a current path can still be formed between the first terminal 35 and the second terminal 36 via the other intact transistor $Q_0$ or $Q_{0'}$. Thus, the ESD protection circuit 44 can prevent static electricity, generated in the process of fabricating the corresponding gate line 30 or data line 31 of the TFT-LCD 300, from destroying other internal circuits (not shown) of the TFT-LCD 300.

The transistors $Q_0$ and $Q_{0'}$ function as electrostatic discharge elements, and may be positive metal-oxide semiconductor (PMOS) transistors, negative metal-oxide semiconductor (NMOS) transistors, or thin film transistors. The number of transistors $Q_0$, $Q_{0'}$ that function as electrostatic discharge elements is not limited to one or two. For example, there may be three, four or more such transistors. In alternative applications, the ESD protection circuits 34 and 44 can be used in other electronic devices such as at an input pad of an integrated circuit.

It is to be understood, however, that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrostatic discharge protection circuit, comprising:
    a first set of serially connected transistors and a second set of serially connected transistors, each transistor comprising a source electrode, a drain electrode, and a gate electrode, wherein in the first set of serially connected transistors, the drain electrode and the gate electrode of each of the transistors are connected to each other, and the source electrode of each of the transistors is connected to the drain electrode of a next adjacent transistor, except for the source electrode of a last one of the transistors, and in the second set of serially connected transistors, the drain electrode and the gate electrode of each of the transistors are connected to each other, and the drain electrode of each of the transistors is connected to the source electrode of a next adjacent transistor, except for the drain electrode of a last one of the transistors; and
    a first electrostatic discharge transistor comprising a source electrode, a drain electrode, and a gate electrode;
    wherein the gate electrode of the first electrostatic discharge transistor, the source electrode of the last transistor of the first set of serially connected transistors and the source electrode of a first one of the transistors of the second set of serially connected transistors are connected to each other, the source electrode of the first electrostatic discharge transistor is connected to the drain electrode of a first one of the transistors of the first set of serially connected transistors, the drain electrode of the first electrostatic discharge transistor is connected to the drain electrode of the last transistor of the second set of serially connected transistors, and the drain electrode of the first electrostatic discharge transistor is connected to the source electrode of the last transistor of the first set of serially connected transistors and to the source electrode of the first transistor of the second set of serially connected transistors.

2. The electrostatic discharge protection circuit as claimed in claim 1, wherein the first and second sets of serially connected transistors are control elements, such that when an electric potential difference between the drain electrode of the first transistor of the first set of serially connected transistors and the drain electrode of the last transistor of the second set of serially connected transistors is greater than a combined threshold voltage of the first and second sets of serially connected transistors, the first electrostatic discharge transistor is turned on and charge flows through the electrostatic discharge protection circuit via the first electrostatic discharge transistor.

3. The electrostatic discharge protection circuit as claimed in claim 1, further comprising a second electrostatic discharge transistor, the second electrostatic discharge transistor comprising a source electrode connected to the source electrode of the first electrostatic discharge transistor, a drain electrode connected to the drain electrode of the first electrostatic discharge transistor, and a gate electrode connected to the gate electrode of the first electrostatic discharge transistor.

4. The electrostatic discharge protection circuit as claimed in claim 3, wherein the first and second sets of serially connected transistors are control elements, such that when an electric potential difference between the drain electrode of the first transistor of the first set of serially connected transistors and the drain electrode of the last transistor of the second set of serially connected transistors is greater than a combined threshold voltage of the first and second sets of serially connected transistors, one or both of the first and second electrostatic discharge transistors is turned on and charge flows through the electrostatic discharge protection circuit via one or both of the first and second electrostatic discharge transistors.

5. The electrostatic discharge protection circuit as claimed in claim 2, wherein the transistors of the first and second sets of serially connected transistors and the first electrostatic discharge transistor are selected from the group consisting of negative metal-oxide semiconductor transistors, positive metal-oxide semiconductor transistors, and thin film transistors.

6. The electrostatic discharge protection circuit as claimed in claim 4, wherein the transistors of the first and second sets of serially connected transistors and the first and second electrostatic discharge transistors are selected from the group consisting of negative metal-oxide semiconductor transistors, positive metal-oxide semiconductor transistors, and thin film transistors.

7. A driving circuit for a liquid crystal display, comprising:
    a plurality of gate lines that are parallel to each other and that each extend along a first direction;
    a plurality of data lines that are parallel to each other and that each extend along a second direction orthogonal to the first direction;
    a plurality of common electrodes; and
    a plurality of electrostatic discharge protection circuits, a plurality of the plurality of electrostatic discharge protection circuits connected between one of the common electrodes and each of the gate lines, respectively, and another plurality of the plurality of electrostatic discharge protection circuits connected between another one of the common electrodes and each of the date lines, respectively;
    wherein each of the electrostatic discharge protection circuits comprises:

a first set of serially connected transistors and a second set of serially connected transistors, each transistor comprising a source electrode, a drain electrode, and a gate electrode, wherein in the first set of serially connected transistors, the drain electrode and the gate electrode of each of the transistors are connected to each other, and the source electrode of each of the transistors is connected to the drain electrode of a next adjacent transistor, except for the source electrode of a last one of the transistors, and in the second set of serially connected transistors, the drain electrode and the gate electrode of each of the transistors are connected to each other, and the drain electrode of each of the transistors is connected to the source electrode of a next adjacent transistor, except for the drain electrode of a last one of the transistors; and a first electrostatic discharge transistor comprising a source electrode, a drain electrode, and a gate electrode;

wherein the gate electrode of the first electrostatic discharge transistor, the source electrode of the last transistor of the first set of serially connected transistors and the source electrode of a first one of the transistors of the second set of serially connected transistors are connected to each other, the source electrode of the first electrostatic discharge transistor is connected to the drain electrode of a first one of the transistors of the first set of serially connected transistors to define a first terminal connected to a corresponding one of the gate lines or a corresponding one of the data lines, the drain electrode of the first electrostatic discharge transistor is connected to the drain electrode of the last transistor of the second set of serially connected transistors to define a second terminal connected to a corresponding one of the common electrodes, and the drain electrode of the first electrostatic discharge transistor is connected to the source electrode of the last transistor of the first set of serially connected transistors and to the source electrode of the first transistor of the second set of serially connected transistors.

8. The driving circuit for a liquid crystal display as claimed in claim 7, wherein the first and second sets of serially connected transistors are control elements, such that when an electric potential difference between the first and second terminals is greater than a combined threshold voltage of the first and second sets of serially connected transistors, the first electrostatic discharge transistor is turned on and charge flows through the electrostatic discharge protection circuit via the first electrostatic discharge transistor.

9. The driving circuit for a liquid crystal display as claimed in claim 7, further comprising a second electrostatic discharge transistor, the second electrostatic discharge transistor comprising a source electrode connected to the source electrode of the first electrostatic discharge transistor, a drain electrode connected to the drain electrode of the first electrostatic discharge transistor, and a gate electrode connected to the gate electrode of the first electrostatic discharge transistor.

10. The driving circuit for a liquid crystal display as claimed in claim 9, wherein the first and second sets of serially connected transistors are control elements, such that when an electric potential difference between the first and second terminals is greater than a combined threshold voltage of the first and second sets of serially connected transistors, one or both of the first and second electrostatic discharge transistors is turned on and charge flows through the electrostatic discharge protection circuit via one or both of the first and second electrostatic discharge transistors.

* * * * *